United States Patent
Park et al.

(10) Patent No.: US 7,710,708 B2
(45) Date of Patent: May 4, 2010

(54) TWO-AXIS GEOMAGNETIC SENSOR AND METHOD FOR MANUFACTURING THE SAME

(75) Inventors: Hae-seok Park, Yongin-si (KR); Joo-ho Lee, Yongin-si (KR); Hyung Choi, Yongin-si (KR); Kyoung-won Na, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 624 days.

(21) Appl. No.: 11/637,767

(22) Filed: Dec. 13, 2006

(65) Prior Publication Data
US 2007/0283585 A1 Dec. 13, 2007

(30) Foreign Application Priority Data
Jun. 12, 2006 (KR) .................. 10-2006-0052618

(51) Int. Cl.
*H01G 5/012* (2006.01)
(52) U.S. Cl. .................. 361/286; 361/277; 361/278; 361/290; 361/292; 324/244; 324/245; 324/249; 324/253; 324/255
(58) Field of Classification Search ......... 361/286–287, 361/290–292, 277–278; 33/355, 356, 335–336; 324/244–245, 249, 253
See application file for complete search history.

(56) References Cited

U.S. PATENT DOCUMENTS

| | | | | | |
|---|---|---|---|---|---|
| 4,950,380 | A | * | 8/1990 | Kurosawa et al. | 204/406 |
| 5,645,349 | A | * | 7/1997 | Fraden | 374/120 |
| 6,090,480 | A | * | 7/2000 | Hayashi | 428/811.2 |
| 6,326,228 | B1 | * | 12/2001 | Hughes et al. | 438/49 |
| 6,462,541 | B1 | * | 10/2002 | Wang et al. | 324/252 |
| 6,472,868 | B1 | * | 10/2002 | Takayama et al. | 324/249 |
| 6,722,199 | B2 | * | 4/2004 | Ploechinger | 73/514.09 |
| 7,382,123 | B2 | * | 6/2008 | Na et al. | 324/253 |
| 7,609,054 | B2 | * | 10/2009 | Tondra et al. | 324/204 |

* cited by examiner

*Primary Examiner*—Nguyen T Ha
(74) *Attorney, Agent, or Firm*—Sughrue Mion, PLLC

(57) ABSTRACT

A two-axis geomagnetic sensor is disclosed. The two-axis geomagnetic sensor includes a first geomagnetic sensor part including a first wafer and a first geomagnetic sensor on a surface of the first wafer; and a second geomagnetic sensor part including a second wafer and a second geomagnetic sensor on a surface of the second wafer. The first and second geomagnetic sensor parts are bonded to each other, in which the first and second geomagnetic sensors positioned in an orthogonal relation to each other. Accordingly, an occupancy area of the geomagnetic sensor can be reduced. Further, the geomagnetic sensor on each axe can have the same magnetic material properties, and alignment deviation cannot be generated.

22 Claims, 7 Drawing Sheets

TWO-AXIS GEOMAGNETIC SENSOR AND METHOD FOR MANUFACTURING THE SAME

CROSS-REFERENCE TO RELATED APPLICATIONS

This application claims priority under 35 U.S.C. §119 from Korean Patent Application No. 10-2006-0052618, filed on Jun. 12, 2006, in the Korean Intellectual Property Office, the disclosure of which is incorporated herein by reference in its entirety.

BACKGROUND OF THE INVENTION

1. Field of the Invention

Apparatuses and methods consistent with the present invention relate to a two-axis geomagnetic sensor and a method for manufacturing the same, and more particularly, to a two-axis geomagnetic sensor and a method for manufacturing the same in which two geomagnetic sensors are fabricated on distinct wafers and then bonded to each other.

2. Description of the Related Art

With a geomagnetic sensor, a direction and a location, or movement, on space can be recognized by sensing the flow of a magnetic field generated by the earth, like a compass. A geomagnetic sensor is widely used in mobile devices such as portable telephones, personal digital assistants (PDAs), game machines, and digital cameras, global positioning systems (GPSs), robotics, and medical fields. A geomagnetic sensor is typically used in two- or three-axis form.

Related art two-axis geomagnetic sensors have been fabricated by incorporating geomagnetic sensors on one wafer to be orthogonal to each other. In this case, when magnetism is applied, a discrepancy arises between properties of magnetic bodies of geomagnetic sensors on respective axes. Thus, it is necessary to correct the discrepancy.

Alternatively, a plurality of geomagnetic sensors arranged in the same direction are fabricated on a single wafer, cut and bonded so that two sensors are orthogonal to each other. In this case, when magnetism is applied, an error in alignment of the sensors arises even though there is no discrepancy between the properties of magnetic bodies of the geomagnetic sensors on respective axes.

Particularly, when a plurality of geomagnetic sensors are fabricated on a single wafer, there arises a problem that an area of an underlying substrate, such as a printed circuit board (PBC) and a low temperature co-fired ceramics (LTCC) is greatly increased.

SUMMARY OF THE INVENTION

The exemplary embodiments of the present invention address the above aspects and other aspects not described above. Also, the present invention is not required to overcome the aspects described above, and an exemplary embodiment of the present invention may not overcome any of the problems described above. The present invention provides a two-axis geomagnetic sensor that is miniaturized by manufacturing two geomagnetic sensors on respective wafers and then bonding them in an orthogonal relation to each other, and a method for manufacturing the same.

According to an aspect of the present invention, a method for manufacturing a two-axis geomagnetic sensor comprises operations of (a) forming a first geomagnetic sensor on a first surface of a first wafer to prepare a first geomagnetic sensor part; (b) forming a second geomagnetic sensor on a first surface of a second wafer to prepare a second geomagnetic sensor part; and (c) bonding the first and second geomagnetic sensor parts such that the first and second geomagnetic sensors are disposed in an orthogonal relation to each other.

Operation (c) may be performed such that a surface of the first geomagnetic sensor on the first surface of the first wafer faces a surface of the second geomagnetic sensor on the first surface of the second wafer.

Additional operations of forming at least one first via connected to the first geomagnetic sensor on the first surface of the first wafer and extending to a second surface of the first wafer which is opposite to the first surface of the first wafer; and at least one second via connected to the second geomagnetic sensor on the first surface of the second wafer and extending to a second surface of the second wafer which is opposite to the first surface of the second wafer, may be further provided.

Operation (c) may be performed such that a surface of the first geomagnetic sensor on the first surface of the first wafer faces a second surface of the second wafer, which is opposite to the first surface of the second wafer.

Additional steps of forming at least one via connected to the first geomagnetic sensor on the first surface of the first wafer and extending to a second surface of the first wafer which is opposite to the first surface of the first wafer; and forming at least one pad for electrical conduction of the second geomagnetic sensor with an external circuit, may be further provided.

Operation (c) may be performed such that a second surface of the first wafer, that is opposite to the first surface of the first wafer, faces a second surface of the second wafer that is opposite to the first surface of the second wafer.

Additional steps of forming at least one first pad for electrical conduction of the first geomagnetic sensor with the external circuit; and forming at least one second pad for electrical conduction of the second geomagnetic sensor with the external circuit, may be further provided.

Operation (a) may comprise forming a first lower coil on the first surface of the first wafer; forming a first insulating layer on the first surface of the first wafer having the first lower coil; forming a first magnetic core of a predetermined shape on the first insulating layer; forming a second insulating layer on the first magnetic core; forming first through electrodes connected to the first lower coil; forming a first upper coil on the second insulating layer, the first upper coil being connected to the first lower coil via the first through electrodes; and forming a third insulating layer on a first surface of the second insulating layer having the first upper coil.

Operation (b) may comprise: forming a second lower coil on the first surface of the second wafer; forming a fourth insulating layer on the first surface of the second wafer having the second lower coil; forming a second magnetic core of a predetermined shape on the fourth insulating layer; forming a fifth insulating layer on the second magnetic core; forming second through electrodes connected to the second lower coil; forming a second upper coil on the fifth insulating layer, the second upper coil being connected to the second lower coil via the second through electrodes; and forming a sixth insulating layer on a first surface of the fifth insulating layer having the second upper coil.

According to another aspect of the present invention, a two-axis geomagnetic sensor is provided, comprising a first geomagnetic sensor part including a first wafer and a first geomagnetic sensor on a first surface of the first wafer; and a second geomagnetic sensor part including a second wafer and a second geomagnetic sensor on a first surface of the second wafer, wherein the first and second geomagnetic sensor parts are bonded to each other, in which the first and second geomagnetic sensors are in an orthogonal relation to each other.

The two-axis geomagnetic sensor may be further provided at least one first via connected to the first geomagnetic sensor on the first surface of the first wafer and extending to a second surface of the first wafer that is opposite to the first surface of the first wafer; and at least one second via connected to the second geomagnetic sensor on the first surface of the second wafer and extending to a second surface of the second wafer that is opposite to the first surface of the second wafer. Here, the first and second geomagnetic sensor parts are bonded to each other, in which a surface of the first geomagnetic sensor on the first surface of the first wafer faces a surface of the second geomagnetic sensor on the first surface of the second wafer.

A circuit board connected to the at least one first via by ball bumping and to the at least one second via by wire bonding may be further provided.

Alternatively, the two-axis geomagnetic sensor may be provided at least one via connected to the first geomagnetic sensor on the first surface of the first wafer and extending to a second surface of the first wafer that is opposite to the first surface of the first wafer; and at least one pad for electrical conduction of the second geomagnetic sensor with an external circuit, may be further provided, and the first and second geomagnetic sensor parts are bonded to each other, in which a surface of the first geomagnetic sensor on the first surface of the first wafer faces a second surface of the second wafer that is opposite to the first surface of the second wafer.

A circuit board connected to the at least one via by ball bumping and connected to the at least one pad by wire bonding may be further provided.

Still alternatively, the two-axis geomagnetic sensor may be provided at least one first pad for electrical conduction of the first geomagnetic sensor with an external circuit; and at least one second pad for electrical conduction of the second geomagnetic sensor with an external circuit, may be further provided, and the first and second geomagnetic sensor parts are bonded to each other, in which a second surface of the first wafer that is opposite to the first surface of the first wafer faces a second a second surface of the second wafer that is opposite to the first surface of the second wafer.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Figure 1A:
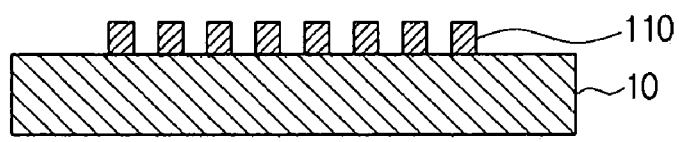
FIGS. 1A to 1G are cross-sectional views illustrating processes of manufacturing a first geomagnetic sensor part according to an exemplary embodiment of the present invention.

Exemplary embodiments of the present invention will be described in detail with reference to the annexed drawings. In the drawings, the same elements are denoted by the same reference numerals throughout the drawings. In the following description, detailed descriptions of known functions and configurations incorporated herein have been omitted for conciseness and clarity.

FIGS. 1A to 1G are cross-sectional views illustrating processes of manufacturing a first geomagnetic sensor part 300 according to an exemplary embodiment of the present invention.

Referring to FIG. 1A, a metal layer is deposited on a first surface of a first wafer 10, coated with photoresist, and subjected to exposure, development, etching, and surface treatment processes to form a first lower coil 110. Alternately, the first lower coil 110 may be formed through a plating process using a plating base layer and photoresist. The first lower coil 110 may be a lower pattern of an exciting coil or a detecting coil, which will be wound around a magnetic core. A thin insulating layer may be formed on both the first surface and a second surface, opposite to the first surface, of the first wafer 10 so that the first lower coil 110 is isolated from the first wafer 10.

Figure 1B:
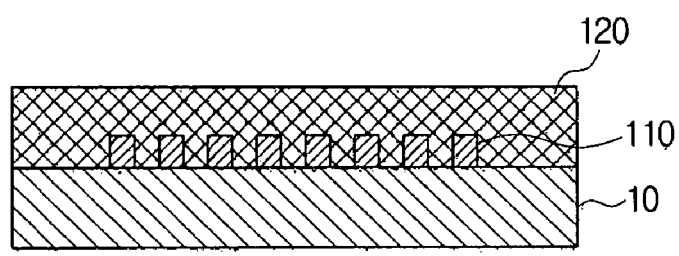

As shown in FIG. 1B, an insulating material is then formed on the first surface of the first wafer 10 having the first lower coil 110 to form a first insulating layer 120, which may be planarized, if necessary. The insulating material may be benzocyclobutene (BCB) having small permittivity.

Figure 1C:
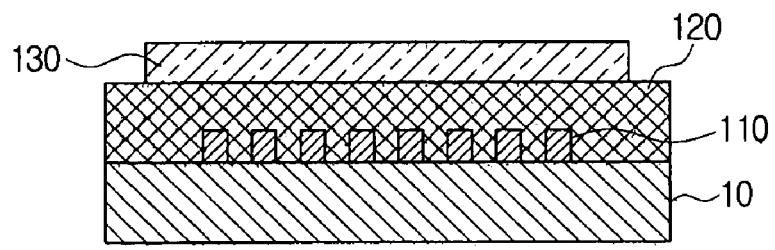

As shown in FIG. 1C, a first magnetic core 130 is formed on the first insulating layer 120. The first magnetic core 130 may include NiFe. The first magnetic core 130 may have one of several shapes including a square ring shape, a circular ring shape, and a two-rectangular-bar shape.

Figure 1D:
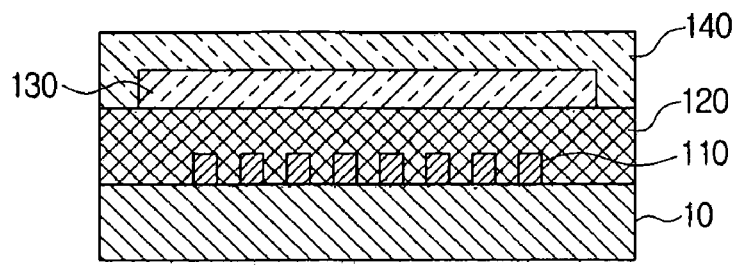

As shown in FIG. 1D, an insulating material is then formed on the first insulating layer 120 having the first magnetic core 130 deposited thereon to form a second insulating layer 140, which may be planarized, if necessary.

Figure 1E:
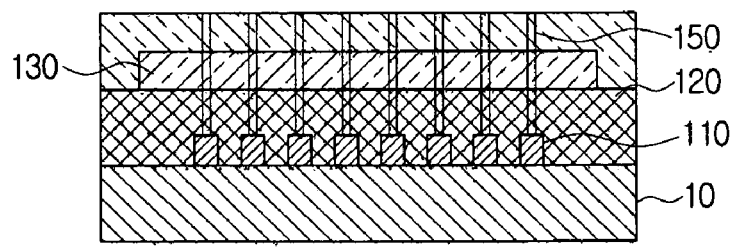

As shown in FIG. 1E, first through electrodes 150 connected to the first lower coil 110 are then formed. The first through electrodes 150 are formed to pass through portions of the second insulating layer 140 and the first insulating layer 120 where the first magnetic core 130 is not deposited.

Figure 1F:
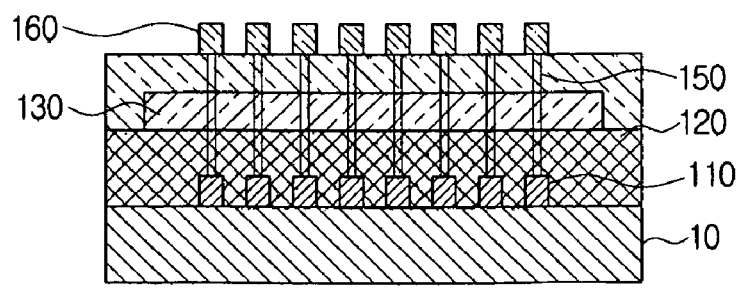

As shown in FIG. 1F, a metal layer is deposited on the second insulating layer 140, coated with photoresist, and subjected to exposure, development, etching and surface treatment processes to form a first upper coil 160. Alternatively, the first upper coil 160 may be formed through a plating process using a plating base layer and photoresist. The first upper coil 160 may be an upper pattern of an exciting coil or a detecting coil, which will be wound around the first magnetic core 130.

The first lower coil 110 and the first upper coil 160 form a coil structure in which the coils wind the first magnetic core 130 by passing though the second insulating layer 140. In this case, the first lower coil 110 and the first upper coil 160 are isolated by the second insulating layer 140.

Figure 1G:
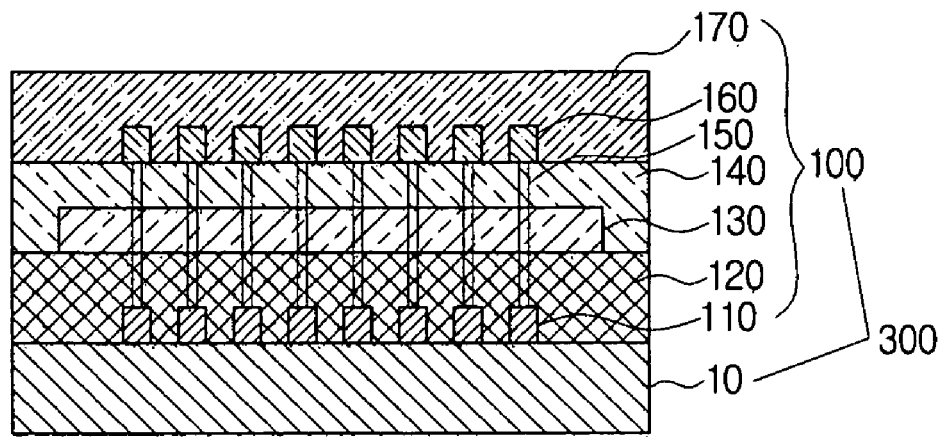

As shown in FIG. 1G, an insulating material is then coated on a first surface of the second insulating layer 140 having the first upper coil 160 deposited thereon to form a third insulating layer 170, which may be planarized, if necessary. The insulating material may be benzocyclobutene (BCB), like the first insulating layer 120 and the second insulating layer 140. Through the processes of FIGS. 1A to 1G, the first geomagnetic sensor part 300 is prepared. Accordingly, the structure formed through the processes of FIGS. 1A to 1G is hereinafter referred to as "the first geomagnetic sensor part 300."

Figure 2:
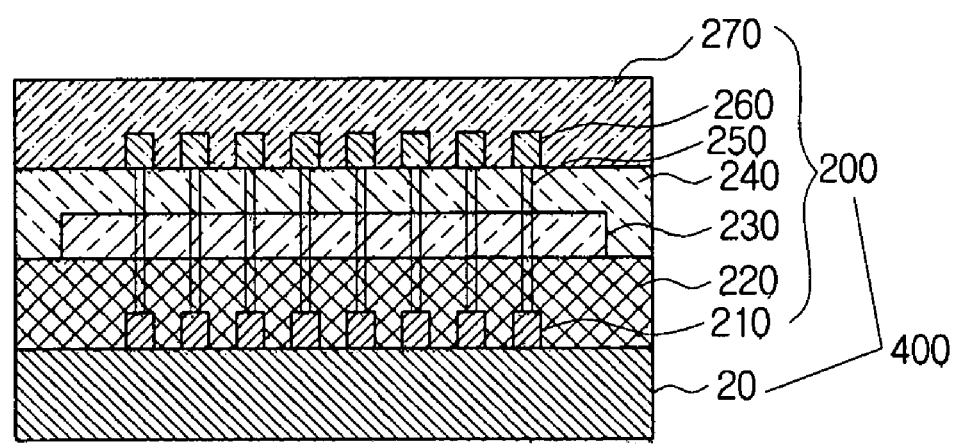
FIG. 2 is a cross-sectional view illustrating a second geomagnetic sensor part according to an exemplary embodiment of the present invention.

FIG. 2 is a cross-sectional view illustrating a second geomagnetic sensor part according to an exemplary embodiment of the present invention. Through the same process as FIGS. 1A to 1G, a second geomagnetic sensor part 400 as shown in FIG. 2 may be fabricated. Accordingly, a process of manufacturing the second geomagnetic sensor part 400 will be omitted. A second wafer 20, a second lower coil 210, a fourth insulating layer 220, a second magnetic core 230, a fifth insulating layer 240, second through electrodes 250, a second upper coil 260, and a sixth insulating layer 270 correspond to those of the first geomagnetic sensor 300 formed through the fabrication processes as shown in FIGS. 1A to 1G.

A two-axis geomagnetic sensor may be prepared by bonding the geomagnetic sensor parts 300 and 400 as shown in FIGS. 1 and 2 in a vertical direction. Specifically, one of the geomagnetic sensor parts is rotated by 90° and then bonded to the other so that the two geomagnetic sensors 100 and 200 are orthogonal to each other.

FIGS. 3 to 6 are cross-sectional views illustrating a method for fabricating a two-axis geomagnetic sensor according to exemplary embodiments of the present invention.

Figure 3:
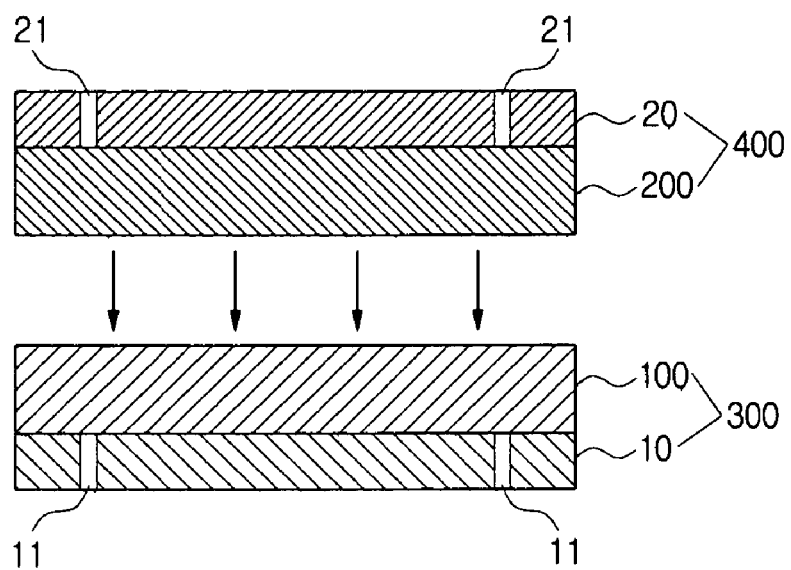
FIGS. 3 to 6 are cross-sectional views illustrating a method for manufacturing a two-axis geomagnetic sensor according to exemplary embodiments of the present invention.

FIG. 3 is a cross-sectional view illustrating a process of bonding a first geomagnetic sensor part 300 and a second geomagnetic sensor part 400, in which a first surface of a first wafer 10 having a first geomagnetic sensor 100 faces a first surface of a second wafer 20 having a second geomagnetic sensor 200. Referring to FIG. 3, the first wafer 10 of the first geomagnetic sensor part 300 includes first vias 11 connected to the first geomagnetic sensor 100 on the first surface of the first wafer 10 and extending to a second surface of the first wafer 10 that is opposite to the first surface of the first wafer 10, and the second wafer 20 of the second geomagnetic sensor part 400 includes second vias 21 connected to the second geomagnetic sensor 200 on the first surface of the second wafer 20 and extending to a second surface of the second wafer 20 that is opposite to the first surface of the second wafer 20.

In this case, the first vias 11 and the second vias 21 may be formed prior to the process of FIG. 1A or between any steps of the processes of FIGS. 1A to 1G. Alternatively, a wafer having the first vias 11 or the second vias 21 formed in advance may be employed.

Figure 4:
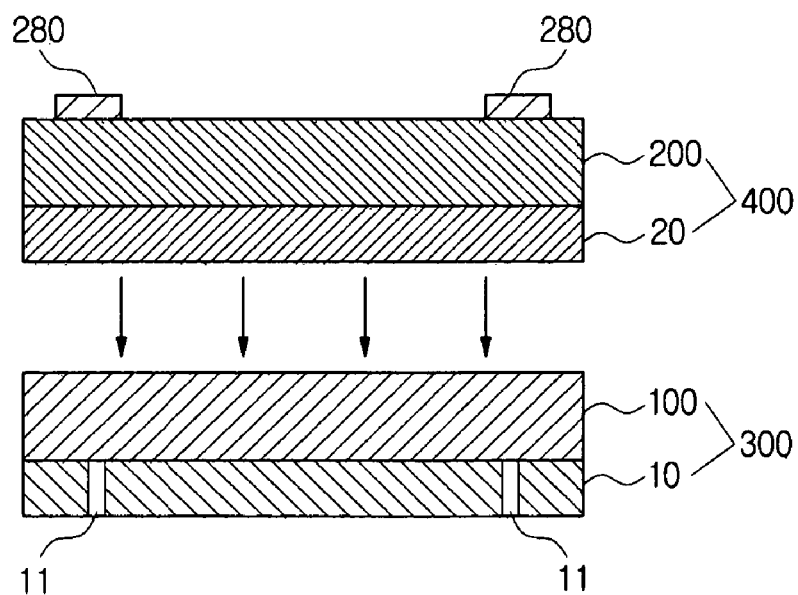

FIG. 4 is a cross-sectional view illustrating a process of bonding a first geomagnetic sensor part 300 and a second geomagnetic sensor part 400, in which the first surface of the first wafer 10 having a first geomagnetic sensor 100 faces the second surface of the second wafer 20 having a second geomagnetic sensor 100. The second surface of the second wafer 20 is opposite to the first surface of the second wafer 20. Referring to FIG. 4, the first wafer 10 of the first geomagnetic sensor part 300 includes the first vias 11 connected to the first geomagnetic sensor 100 and extending to the second surface of the first wafer 10. The second geomagnetic sensor part 400 includes second pads 280 for electrical conduction with an external circuit, which are formed on a first surface of the second geomagnetic sensor 200. In this case, the first vias 11 may be formed in any one of the processes of FIG. 2 corresponding to FIGS. 1A to 1G. Alternatively, a wafer having the first vias 11 formed in advance may be employed.

Figure 5:
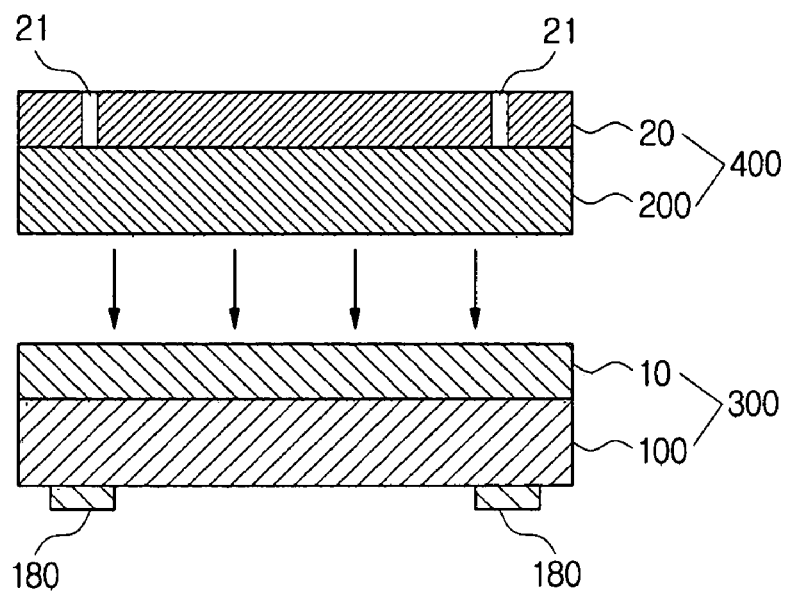

FIG. 5 is a cross-sectional view illustrating a process of bonding a first geomagnetic sensor part 300 and a second geomagnetic sensor part 400, in which the second surface of the first wafer 10 having the first geomagnetic sensor 100 faces the first surface of the second wafer 20 having the second geomagnetic sensor 200. Referring to FIG. 5, the first geomagnetic sensor part 300 includes first pads 180 for electrical conduction with an external circuit, which are formed on a first surface of the first geomagnetic sensor 100. The second wafer 20 of the second geomagnetic sensor part 400 includes the second vias 21 connected to the second geomagnetic sensor 200 on the first surface of the second wafer 20 and extending to the second surface of the second wafer 20.

In this case, the first pads 180 may be formed after the process of FIG. 1G, and the second vias 21 may be formed in any process of FIG. 2 corresponding to FIGS. 1A to 1G. Alternatively, a wafer having the second vias 21 formed in advance may be employed.

Figure 6:
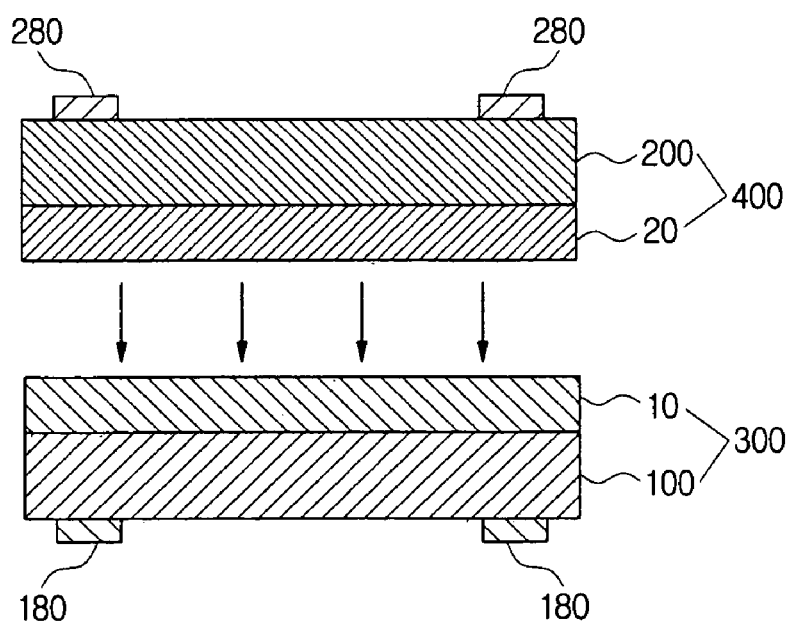

FIG. 6 is a cross-sectional view illustrating a process of bonding the first geomagnetic sensor part 300 and the second geomagnetic sensor part 400, in which the second surface of the first wafer 10 having the first geomagnetic sensor 100 is positioned to face the second surface of the second wafer 20 having the second geomagnetic sensor 200.

The first geomagnetic sensor part 300 includes the first pads 180 for electrical conduction with an external circuit, which are formed on the first surface of the first geomagnetic sensor 100. The second geomagnetic sensor part 400 includes the second pads 280 for electrical conduction with an external circuit, which are formed on the first surface of the second geomagnetic sensor 200. In this case, the first pads 180 may be formed in FIG. 1G that is the last step of the manufacturing process, and the second pads 280 may be formed in the process of FIG. 2.

FIGS. 7 to 10 are cross-sectional views illustrating a structure of a two-axis geomagnetic sensor according to exemplary embodiments of the present invention. The two-axis geomagnetic sensors fabricated through the process as shown in FIGS. 3 to 6 may be connected to the circuit board 500, as shown in FIGS. 7 to 10. Here, the circuit board 500 may be for example a printed circuit board (PBC) and a low temperature co-fired ceramics (LTCC).

Figure 7:
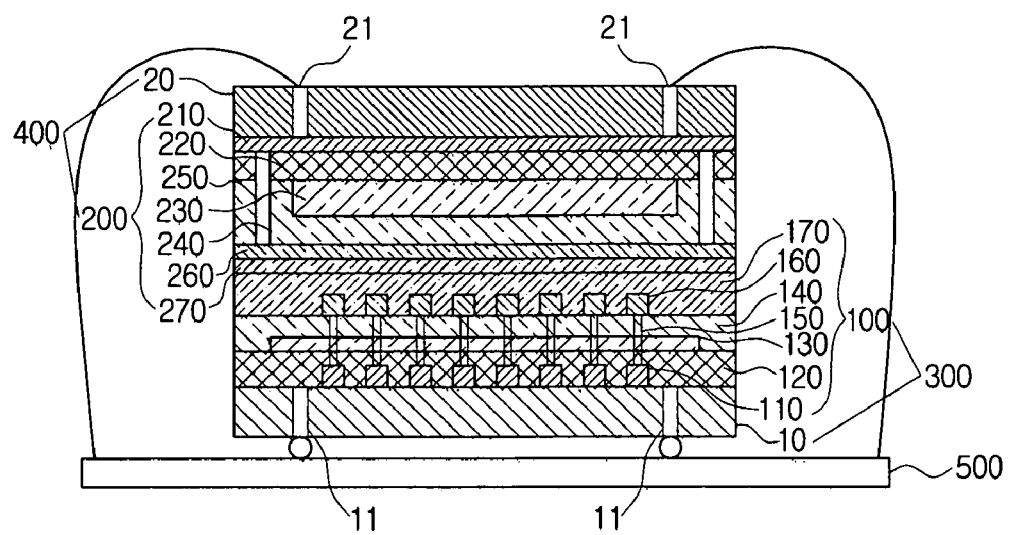
FIGS. 7 to 10 are cross-sectional views illustrating the structure of a two-axis geomagnetic sensor according to exemplary embodiments of the present invention.

FIG. 7 illustrates a two-axis geomagnetic sensor having a first geomagnetic sensor part 300 and a second geomagnetic sensor part 400 bonded in the bonding direction of FIG. 3. It can be seen from FIG. 7 that the parts are connected to a circuit board 500 supporting the two-axis geomagnetic sensor. In this case, the circuit board 500 supports the second surface of the first wafer 10 having the first geomagnetic sensor 100. The circuit board 500 may be electrically connected to the first geomagnetic sensor 100 by ball bumping of the first vias 11 and to the second geomagnetic sensor 200 by wire bonding of the second vias 21.

Figure 8:
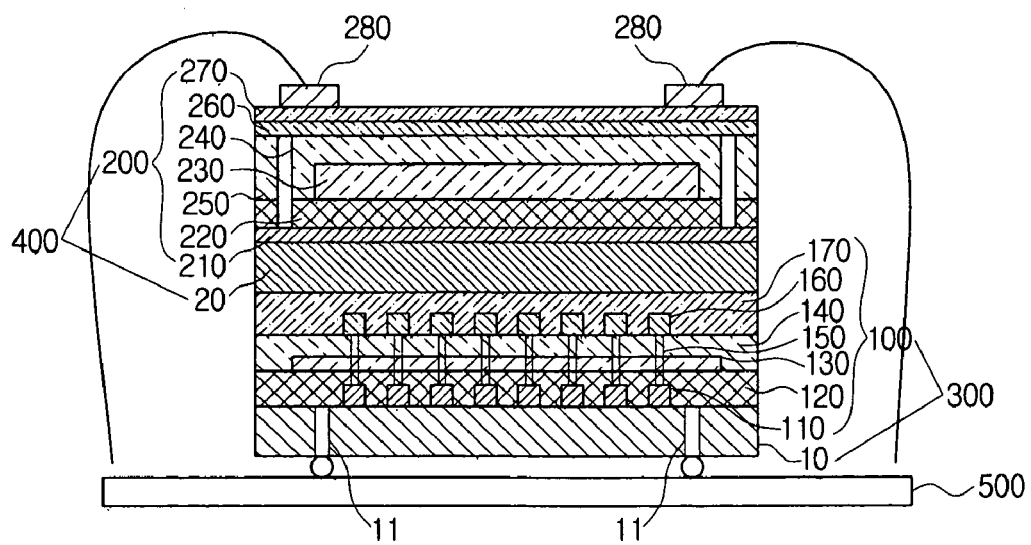

FIG. 8 illustrates a two-axis geomagnetic sensor having the first geomagnetic sensor part 300 and the second geomagnetic sensor part 400 bonded in the bonding direction of FIG. 4. It can be seen from FIG. 8 that the parts are connected to a circuit board 500 supporting the two-axis geomagnetic sensor. In this case, the circuit board 500 supports the second surface of the first wafer 10 having the first geomagnetic sensor 100. The circuit board 500 may be electrically connected to the first geomagnetic sensor 100 by ball bumping of the first vias 11 formed in the first wafer 10, and to the second geomagnetic sensor 200 by wire bonding of the second pads 280.

Figure 9:
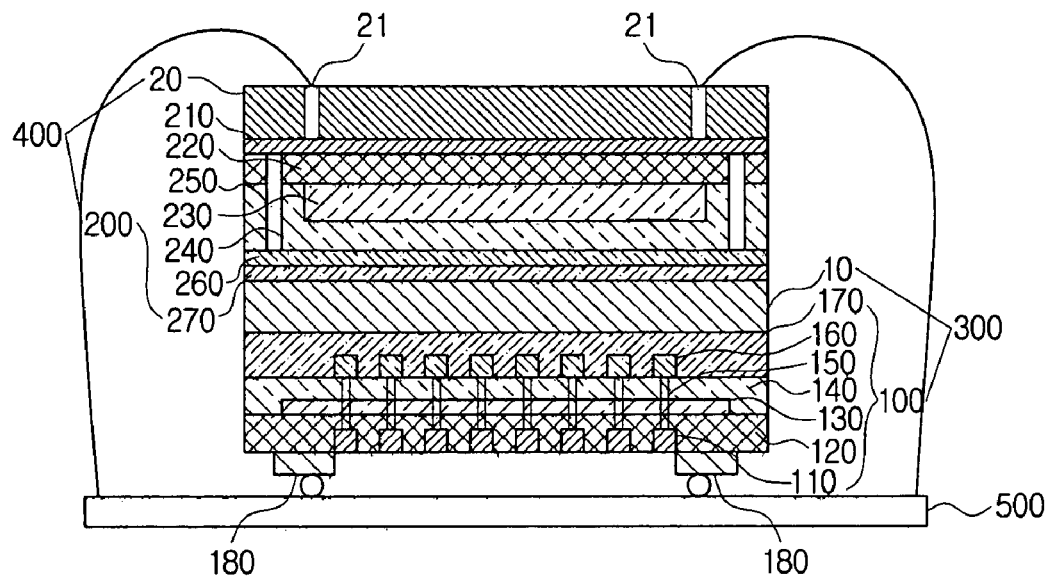

FIG. 9 illustrates a two-axis geomagnetic sensor having the first geomagnetic sensor part 300 and the second geomagnetic sensor part 400 bonded in the bonding direction of FIG. 5. It can be seen from FIG. 9 that the parts are connected to a circuit board 500 supporting the two-axis geomagnetic sensor. In this case, the circuit board 500 supports the first surface of the first geomagnetic sensor 100. The circuit board 500 may be electrically connected to the first geomagnetic sensor 100 by ball bumping of the first pads 180 formed on the first geomagnetic sensor 100, and to the second geomagnetic sensor 200 by wire bonding of the second vias 21 formed in the second geomagnetic sensor 20.

Figure 10:
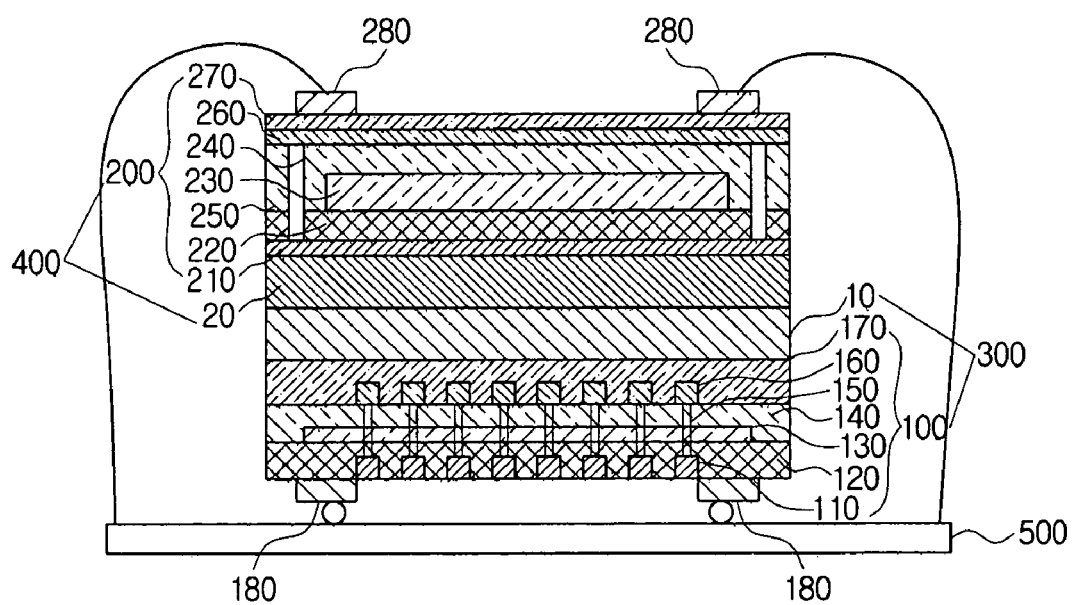

FIG. 10 illustrates a two-axis geomagnetic sensor having the first geomagnetic sensor part 300 and the second geomagnetic sensor part 400 bonded in the bonding direction of FIG. 6. It can be seen from FIG. 10 that the parts are connected to a circuit board 500 supporting the two-axis geomagnetic sensor. In this case, the circuit board 500 supports the first surface of the first geomagnetic sensor 100. The circuit board 500 may be electrically connected to the first geomagnetic sensor 100 by ball bumping of the first pads 180 formed on the first geomagnetic sensor 100 and to the second geomagnetic sensor 200 by wire bonding of the second pads 280.

The two-axis geomagnetic sensors of FIGS. 7 to 10 may be employed in a geomagnetism detection-based navigation system, a geomagnetic variation monitor (earthquake prediction), biomagnetism measurement, and metal defect detection. Furthermore, it can be indirectly applied to a magnetic encoder, a contackless potentiometer, a current sensor, a torque sensor, a displacement sensor, etc.

As described above, according to the exemplary embodiments of the present invention, the two-axis geomagnetic sensor can be fabricated on one geomagnetic sensor area by fabricating two geomagnetic sensors on the respective wafers and then bonding them in an orthogonal relation to each other. This can reduce the occupancy area of the geomagnetic sensor, thereby obtaining a small two-axis geomagnetic sensor.

Further, properties of magnetic bodies of geomagnetic sensors on respective axes can be equalized and an alignment error can be minimized, thereby facilitating the manufacture of the sensor.

The foregoing exemplary embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method for manufacturing a two-axis geomagnetic sensor comprising operations of:
   (a) forming a first geomagnetic sensor on a first surface of a first wafer to prepare a first geomagnetic sensor part;
   (b) forming a second geomagnetic sensor on a first surface of a second wafer to prepare a second geomagnetic sensor part; and
   (c) bonding the first and second geomagnetic sensor parts such that the first and second geomagnetic sensors are disposed in an orthogonal relation to each other.

2. The method as claimed in claim 1, wherein operation (c) is performed such that a surface of the first geomagnetic sensor on the first surface of the first wafer faces a surface of the second geomagnetic sensor on the first surface of the second wafer.

3. The method as claimed in claim 2, further comprising:
   forming at least one first via connected to the first geomagnetic sensor on the first surface of the first wafer and extending to a second surface of the first wafer which is opposite to the first surface of the first wafer; and
   forming at least one second via connected to the second geomagnetic sensor on the first surface of the second wafer and extending to a second surface of the second wafer which is opposite to the first surface of the second wafer.

4. The method as claimed in claim 1, wherein operation (c) is performed such that a surface of the first geomagnetic sensor on the first surface of the first wafer faces a second surface of the second wafer which is opposite to the first surface of the second wafer.

5. The method as claimed in claim 4, further comprising:
   forming at least one via connected to the first geomagnetic sensor on the first surface of the first wafer and extending to a second surface of the first wafer which is opposite to the first surface of the first wafer; and
   forming at least one pad for electrical conduction of the second geomagnetic sensor with an external circuit.

6. The method as claimed in claim 1, wherein operation (c) is performed such that a second surface of the first wafer, which is opposite to the first surface of the first wafer, faces a surface of the second geomagnetic sensor on the first surface of the second wafer.

7. The method as claimed in claim 6, further comprising:
   forming at least one pad for electrical conduction of the first geomagnetic sensor with an external circuit; and
   forming at least one via connected to the second geomagnetic sensor on the first surface of the second wafer and extending to a second surface of the second wafer which is opposite to the first surface of the second wafer.

8. The method as claimed in claim 1, wherein operation (c) is performed such that a second surface of the first wafer, which is opposite to the first surface of the first wafer, faces a second surface of the second wafer which is opposite to the first surface of the second wafer.

9. The method as claimed in claim 8, further comprising:
   forming at least one first pad for electrical conduction of the first geomagnetic sensor with the external circuit; and
   forming at least one second pad for electrical conduction of the second geomagnetic sensor with the external circuit.

10. The method as claimed in claim 1, wherein operation (a) comprises:
    forming a first lower coil on the first surface of the first wafer;
    forming a first insulating layer on the first surface of the first wafer having the first lower coil;
    forming a first magnetic core of a predetermined shape on the first insulating layer;
    forming a second insulating layer on the first magnetic core;
    forming first through electrodes connected to the first lower coil;
    forming a first upper coil on the second insulating layer, the first upper coil being connected to the first lower coil via the first through electrodes; and
    forming a third insulating layer on a first surface of the second insulating layer having the first upper coil.

11. The method as claimed in claim 1, wherein operation (b) comprises:
    forming a second lower coil on the first surface of the second wafer;
    forming a fourth insulating layer on the first surface of the second wafer having the second lower coil;
    forming a second magnetic core of a predetermined shape on the fourth insulating layer;
    forming a fifth insulating layer on the second magnetic core;

forming second through electrodes connected to the second lower coil;
forming a second upper coil on the fifth insulating layer, the second upper coil being connected to the second lower coil via the second through electrodes; and
forming a sixth insulating layer on a first surface of the fifth insulating layer having the second upper coil.

12. The method as claimed in claim 1, wherein an axis of the first geomagnetic sensor and an axis of the second geomagnetic sensor are configured to be perpendicular to each other to obtain geomagnetic data of two axes.

13. A two-axis geomagnetic sensor comprising:
a first geomagnetic sensor part comprising a first wafer and a first geomagnetic sensor on a first surface of the first wafer; and
a second geomagnetic sensor part comprising a second wafer and a second geomagnetic sensor on a first surface of the second wafer,
wherein the first and second geomagnetic sensor parts are bonded to each other, in which the first and second geomagnetic sensors are in an orthogonal relation to each other.

14. The two-axis geomagnetic sensor as claimed in claim 13, further comprising:
at least one first via connected to the first geomagnetic sensor on the first surface of the first wafer and extending to a second surface of the first wafer that is opposite to the first surface of the first wafer; and
at least one second via connected to the second geomagnetic sensor on the first surface of the second wafer and extending to a second surface of the second wafer that is opposite to the first surface of the second wafer,
wherein the first and second geomagnetic sensor parts are bonded to each other, in which a surface of the first geomagnetic sensor on the first surface of the first wafer faces a surface of the second geomagnetic sensor on the first surface of the second wafer.

15. The two-axis geomagnetic sensor as claimed in claim 14, further comprising a circuit board connected to the at least one first via by ball bumping and to the at least one second via by wire bonding.

16. The two-axis geomagnetic sensor as claimed in claim 13, further comprising:
at least one via connected to the first geomagnetic sensor on the first surface of the first wafer and extending to a second surface of the first wafer that is opposite to the first surface of the first wafer; and
at least one pad for electrical conduction of the second geomagnetic sensor with an external circuit,
wherein the first and second geomagnetic sensor parts are bonded to each other, in which a surface of the first geomagnetic sensor on the first surface of the first wafer faces a second surface of the second wafer that is opposite to the first surface of the second wafer.

17. The two-axis geomagnetic sensor as claimed in claim 16, further comprising a circuit board connected to the at least one via by ball bumping and connected to the pads by wire bonding.

18. The two-axis geomagnetic sensor as claimed in claim 13, further comprising:
at least one pad for electrical conduction of the first geomagnetic sensor with an external circuit; and
at least one via connected to the second geomagnetic sensor on the first surface of the second wafer and extending to a second surface of the second wafer which is opposite to the first surface of the second wafer,
wherein the first and second geomagnetic sensor parts are bonded to each other, in which a second surface of the first wafer that is opposite to the first surface of the first wafer faces a surface of the second geomagnetic sensor on the first surface of the second wafer.

19. The two-axis geomagnetic sensor as claimed in claim 18, further comprising a circuit board connected to the at least one pad by ball bumping and connected to the at least one via by wire bonding.

20. The two-axis geomagnetic sensor as claimed in claim 13, further comprising:
at least one first pad for electrical conduction of the first geomagnetic sensor with an external circuit; and
at least one second pad for electrical conduction of the second geomagnetic sensor with an external circuit, wherein
the first and second geomagnetic sensor parts are bonded to each other, in which a second surface of the first wafer, that is opposite to the first surface of the first wafer, faces a second surface of the second wafer that is opposite to the first surface of the second wafer.

21. The two-axis geomagnetic sensor as claimed in claim 20, further comprising a circuit board connected to the at least one first pad by ball bumping and to the at least one second pad by wire bonding.

22. The two-axis geomagnetic sensor as claimed in claim 13, wherein an axis of the first geomagnetic sensor and an axis of the second geomagnetic sensor are configured to be perpendicular to each other to obtain geomagnetic data of two axes.

* * * * *